(12) United States Patent
Neukam

(10) Patent No.: US 9,986,635 B2
(45) Date of Patent: May 29, 2018

(54) ASSEMBLY AND ELECTRONIC DEVICE WITH CONDUCTIVE MESH

(71) Applicant: Fujitsu Technology Solutions Intellectual Property GmbH, München (DE)

(72) Inventor: Wilhelm Neukam, Bobingen (DE)

(73) Assignee: Fujitsu Technology Solutions Intellectual Property GmbH (DE)

( * ) Notice: Subject to any disclaimer, the term of this patent is extended or adjusted under 35 U.S.C. 154(b) by 0 days. days.

(21) Appl. No.: 15/379,778

(22) Filed: Dec. 15, 2016

(65) Prior Publication Data

US 2017/0181273 A1 Jun. 22, 2017

(30) Foreign Application Priority Data

Dec. 16, 2015 (DE) .................. 10 2015 122 000

(51) Int. Cl.
| | | |
|---|---|---|
| H05K 1/02 | (2006.01) | |
| H05K 5/02 | (2006.01) | |
| H05K 1/03 | (2006.01) | |
| H05K 7/14 | (2006.01) | |
| H05K 3/20 | (2006.01) | |

(52) U.S. Cl.
CPC ......... *H05K 1/0275* (2013.01); *H05K 1/0284* (2013.01); *H05K 1/03* (2013.01); *H05K 3/20* (2013.01); *H05K 5/0208* (2013.01); *H05K 7/1427* (2013.01); *H05K 2201/0388* (2013.01); *H05K 2201/07* (2013.01); *H05K 2201/09154* (2013.01); *H05K 2201/09681* (2013.01)

(58) Field of Classification Search
None
See application file for complete search history.

(56) References Cited

U.S. PATENT DOCUMENTS

| | | | | |
|---|---|---|---|---|
| 4,631,641 A | * | 12/1986 | Brombal ............. | H05K 7/1439 174/351 |
| 5,825,618 A | * | 10/1998 | Schnoor .............. | H05K 5/0021 361/679.6 |
| 5,959,844 A | * | 9/1999 | Simon .................... | B60K 37/02 307/10.1 |
| 6,617,939 B1 | * | 9/2003 | Vermeersch ......... | H01R 13/719 333/28 R |

(Continued)

FOREIGN PATENT DOCUMENTS

| | | |
|---|---|---|
| DE | 41 15 703 C1 | 8/1992 |
| EP | 1 015 955 | 7/2000 |

(Continued)

OTHER PUBLICATIONS

Combined Search and Examination Report dated May 26, 2017, of corresponding GB Application No. 1621409.0.

*Primary Examiner* — Timothy Thompson
*Assistant Examiner* — Muhammed Azam
(74) *Attorney, Agent, or Firm* — DLA Piper LLP (US)

(57) ABSTRACT

An assembly includes a carrier and an electrically conductive mesh, wherein the carrier includes a side surface with an edge, the electrically conductive mesh is attached to the side surface and extends over the edge of the side surface, and the edge has a radius at least as big as a minimal bending radius of electric lines of the electrically conductive mesh.

6 Claims, 3 Drawing Sheets

(56) References Cited

U.S. PATENT DOCUMENTS

| | | | | |
|---|---|---|---|---|
| 6,747,877 B2* | 6/2004 | Tonozuka | | G06F 1/182 |
| | | | | 361/679.32 |
| 6,957,345 B2* | 10/2005 | Cesana | | G08B 13/128 |
| | | | | 713/193 |
| 7,012,796 B2* | 3/2006 | Chen | | G06F 1/182 |
| | | | | 361/220 |
| 7,643,311 B2* | 1/2010 | Coffy | | H01L 21/561 |
| | | | | 174/350 |
| 8,053,872 B1* | 11/2011 | Swan | | C25D 5/12 |
| | | | | 257/659 |
| 8,325,486 B2* | 12/2012 | Arshad | | G06F 21/86 |
| | | | | 361/42 |
| 8,363,861 B2* | 1/2013 | Hughes | | H04N 5/64 |
| | | | | 348/61 |
| 2002/0084090 A1* | 7/2002 | Farquhar | | G06F 21/87 |
| | | | | 174/541 |
| 2002/0154474 A1* | 10/2002 | Merz | | G06F 1/1616 |
| | | | | 361/679.6 |
| 2003/0009684 A1* | 1/2003 | Schwenck | | H01L 23/573 |
| | | | | 713/194 |
| 2004/0240191 A1* | 12/2004 | Arnold | | H01L 23/04 |
| | | | | 361/800 |
| 2005/0012199 A1* | 1/2005 | Rosenau | | G02B 6/4201 |
| | | | | 257/696 |
| 2005/0152106 A1* | 7/2005 | Coster | | G06F 1/181 |
| | | | | 361/679.58 |
| 2005/0160702 A1* | 7/2005 | Perreault | | G08B 13/128 |
| | | | | 53/449 |
| 2005/0207127 A1* | 9/2005 | Sinha | | G06F 21/86 |
| | | | | 361/752 |
| 2006/0221559 A1* | 10/2006 | Campini | | H05K 7/1461 |
| | | | | 361/679.36 |
| 2006/0254811 A1* | 11/2006 | Kirstein | | H05K 1/038 |
| | | | | 174/256 |
| 2007/0001844 A1* | 1/2007 | Krill | | G08B 13/12 |
| | | | | 340/545.1 |
| 2007/0038865 A1* | 2/2007 | Oggioni | | G06F 21/87 |
| | | | | 713/178 |
| 2008/0106400 A1* | 5/2008 | Hunter | | G06F 21/87 |
| | | | | 340/540 |
| 2010/0053869 A1* | 3/2010 | Sun | | G06F 1/181 |
| | | | | 361/679.6 |
| 2010/0157566 A1* | 6/2010 | Bogursky | | H05K 9/0032 |
| | | | | 361/816 |
| 2013/0050962 A1* | 2/2013 | Kratzer | | H05K 9/0028 |
| | | | | 361/752 |
| 2014/0021254 A1* | 1/2014 | Marshall | | G07F 7/0873 |
| | | | | 235/435 |
| 2014/0028335 A1* | 1/2014 | Salle | | G08B 13/12 |
| | | | | 324/705 |
| 2015/0242659 A1* | 8/2015 | Chen | | G06K 7/01 |
| | | | | 235/439 |
| 2015/0277501 A1* | 10/2015 | Sugiyama | | G06F 21/86 |
| | | | | 361/679.57 |
| 2017/0181273 A1* | 6/2017 | Neukam | | H05K 1/0275 |

FOREIGN PATENT DOCUMENTS

| | | |
|---|---|---|
| JP | 2008-130617 A | 6/2008 |
| WO | 2007/003227 A1 | 1/2007 |
| WO | 2008/009630 A1 | 1/2008 |
| WO | 2017/051282 | 3/2017 |

* cited by examiner

ASSEMBLY AND ELECTRONIC DEVICE WITH CONDUCTIVE MESH

TECHNICAL FIELD

This disclosure relates to an assembly with a carrier and an electrically conductive mesh as well as an electrical device with an assembly.

BACKGROUND

To deny access to security-relevant components to a potential attacker, security-relevant components can be protected by an electrically conductive mesh by which an access attempt can be detected. In that case, the assembly of the electrically-conductive mesh around the security-relevant components is decisive. If one tries to introduce an electrically conductive mesh into a housing of an electric device, it may easily happen that electric lines of the electrically conductive mesh are damaged. In particular, it may happen that electric lines break or are damaged at kinks in the lines.

Thus, it could be helpful to provide suitable means to prevent damaging of an electrically conductive mesh.

SUMMARY

An assembly includes a carrier and an electrically conductive mesh, where-in the carrier includes a side surface with an edge, the electrically conductive mesh is attached to the side surface and extends over the edge of the side surface, and the edge has a radius at least as big as a minimal bending radius of electric lines of the electrically conductive mesh.

An electronic device includes the assembly including a carrier and an electrically conductive mesh, wherein the carrier includes a side surface with an edge, the electrically conductive mesh is attached to the side surface and extends over the edge of the side surface, and the edge has a radius at least as big as a minimal bending radius of electric lines of the electrically conductive mesh, and a circuit board, on which security-relevant electronics are arranged, wherein the circuit board is arranged on the carrier such that the electrically conductive mesh at least partially surrounds the circuit board.

Figure 1:
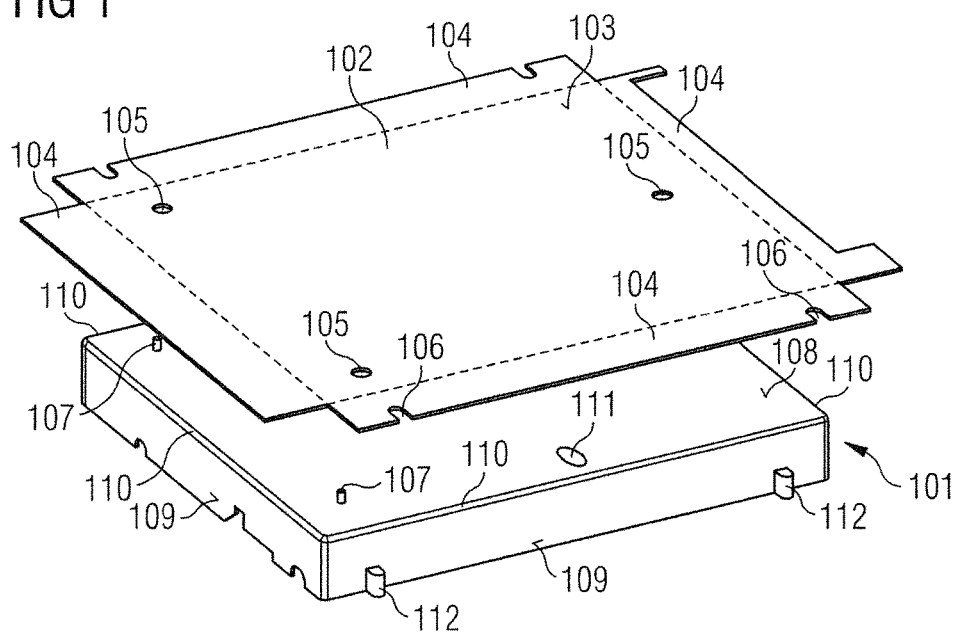
FIG. 1 is a perspective schematic illustration of an example of a carrier and an electrically conductive mesh.

LIST OF REFERENCE NUMERALS 100 assembly
101 carrier
102 mesh
103,108 base
104 lugs
105 centering hole
106 recesses
107 centering pin
109 side surface
110 edge
111 guidance
112 spacer
113 arrow
114 housing

DETAILED DESCRIPTION

An assembly includes a carrier and an electrically conductive mesh. The carrier comprises a side surface with an edge. The electrically conductive mesh is attached to the side surface and extends over the edge of the side surface. The edge has a radius at least as big as a minimal bending radius of electric lines of the electrically conductive mesh.

Such a carrier with one or multiple edges having a radius at least as big as a minimal bending radius of the electric lines effectively protects the electrically conductive mesh from damage or a break of the electric lines of the electrically conductive mesh. The minimal bending radius depends on the material used and refers to the smallest radius around which the electrically conductive mesh can be bent without damage. The electrically conductive mesh can be cambered over the edges of the carrier, for example. The predetermined radius of the edges prevents the electrically conductive mesh from bending too strongly so that it is protected.

A carrier of the described type thus describes a technical tool for an improved and safe mounting of an electrically conductive mesh, respectively, in a housing of an electric device.

The carrier may comprise centering means. The electrically conductive mesh is advantageously arranged centrally on the carrier by the centering means. In this way, a predetermined position of the mesh can be set in relation to the carrier and/or a receiving housing.

To secure electronic components in a device to be protected, it is important that the electrically conductive mesh can be arranged very precisely on the carrier so that no gaps develop in the protection offered by the electrically conductive mesh. By the centering means, it is ensured that the electrically conductive mesh can be arranged in the predetermined position of the carrier. In particular, the centering means are centering pins that engage in the centering holes of the electrically conductive mesh.

The electrically conductive mesh may connect to the carrier via an adhesive joint.

An adhesive joint produces a material-fit connection between the electrically conductive mesh and the carrier. A reliable connection between the mesh and the carrier can be ensured by the adhesive.

The carrier may comprise multiple side surfaces. The side surfaces of the carrier advantageously form a circumferential frame.

A frame is particularly suitable for carrying an electrically conductive mesh due to its stable construction.

The carrier may have a base with which the multiple side surfaces are connected.

By the base, in particular a rectangular base with which the multiple side surfaces connect, a tray-shaped reception is formed on the external surface of which can be attached the electrically conductive mesh. This way, electronics to be protected can be positioned within the tray-shaped reception in a simple manner.

Each of the side surfaces may comprise one edge. The edges of the side surfaces each have a radius at least as big as a minimal bending radius of electric lines of the electrically conductive mesh. Advantageously, the side surfaces connect to the base in each case via such edges.

The edges of the carrier that adjoin the base and over which the electrically conductive mesh is cambered, all comprise a radius big enough that the mesh cambered over a respective edge will not suffer from damage. The radii of the individual edges may comprise different radii. Preferably, the individual edges of the side surfaces have the same radius.

The carrier may be made from a plastic material. A plastic material is characterized by good insulation capabilities and low weight. Furthermore, a plastic material can be formed in a simple and cost-efficient manner.

The electrically conductive mesh may have a rectangular base to which one or multiple lugs are adjoined, wherein the mesh is arranged with the one or multiple lugs at the side surface. Arranging the electrically conductive mesh on the side surface allows centering the electrically conductive mesh independently from a base of the carrier.

An electronic device has an assembly of the above described type and a circuit board. Security-relevant electronics are arranged on the circuit board. The circuit board is arranged on the carrier such that the electrically conductive mesh at least partially surrounds the circuit board.

The electrically conductive mesh is arranged on the carrier. The circuit board with the security-relevant electronics is arranged in or on the carrier such that the electrically conductive mesh at least partially surrounds the circuit board, in particular from four sides or from five sides. Thus, protection for the circuit board is ensured at the regions of the circuit board surrounded by the mesh since an unauthorized access attempt to the security-relevant electronics is detectable via the electrically conductive mesh.

The electronic device may comprise a housing, wherein the assembly is arranged in the housing such that the electrically conductive mesh is arranged between the circuit board and the housing.

The carrier is arranged in the housing. The security-relevant electronics is arranged in the region surrounded by the electrically conductive mesh. The electronic device is thereby protected against unauthorized external access attempts to the security-relevant electronics.

Hereinafter, my assemblies and devices will be described in greater detail by Figures and examples.

It will be appreciated that the following description is intended to refer to specific examples of structure selected for illustration in the drawings and is not intended to define or limit the disclosure, other than in the appended claims.

FIG. 1 shows a carrier 101 and an electrically conductive mesh 102. The carrier 101 carries the electrically conductive mesh 102 and to ensure that the electrically conductive mesh 102 maintains a predetermined shape without damage.

The electrically conductive mesh 102 is a braid or knitted fabric of electric lines arranged or attached to a carrier material, e.g., a foil, in a loose manner. The electric lines can be wires or electrically conductive paints or a combination thereof. The electrically conductive mesh 102 comprises a foil to which electric lines are attached. The electrically conductive mesh 102 is cut stencil-like into a certain shape. The electrically conductive mesh 102 comprises a base 103. The base 103 has a rectangular design, but may comprise any other application-specific shapes. At side edges of the base 103, the electrically conductive mesh 102 merges into lugs 104. The stencil-like design of the electrically conductive mesh 102 is adapted to a surface of the carrier 101.

The electrically conductive mesh 102 comprises centering holes 105. The centering holes 105 cooperate with the centering pins 106 of the carrier 101 to secure a position of the electrically conductive mesh 102 on the carrier 101.

The electrically conductive mesh 102 comprises recessess 106 which are part of the stencil-like example of the electrically conductive mesh 102 and adapted to the shape of the carrier 101, in particular spacers 112 of the carrier 101.

The carrier 101 has a base 108. Furthermore, the carrier 101 has four side surfaces 109. Due to the perspective illustration in FIGS. 1 to 5, merely up to two side surfaces 109 are illustrated, respectively. The four side surfaces 109 form a circumferential frame which is separate from the base 108 of the carrier 101.

The base 108 of the carrier 101 connects to the side surfaces 109 via edges 110. The base 108 as well as the side surfaces 109 each form a flat surface. The edges 110 are curved and comprise a predefined radius (see in particular FIG. 2). The radius is adapted to material properties of the electrically conductive mesh 102.

The radius of the edges 110 is selected such that the electric lines of the electrically conductive mesh 102 can be bent over the edges 110 without damage and the electrically conductive mesh 102 is not damaged. In particular, the radius of the edges 110 is selected to be bigger than a minimal bending radius of the electrically conductive mesh 102.

The carrier 101 comprises centering pins 107. In the example shown in FIGS. 1 to 5, the centering pins 107 are arranged on the base 108. In this example, three centering pins 107 are arranged on the base 108, two of which centering pins 107 are merely shown in FIG. 1 due to the perspective illustration.

Furthermore, the carrier 101 comprises a guidance 111 provided for an electrically conductive elastomeric material that contacts the electrically conductive mesh 102 with one contact point or multiple contact points of a circuit board (not shown) located in or underneath the carrier 101.

Furthermore, the carrier comprises the spacers 112 that keep the carrier 101 spaced apart from housing walls during and after insertion into a housing and/or define a certain mounting position.

Figure 2:
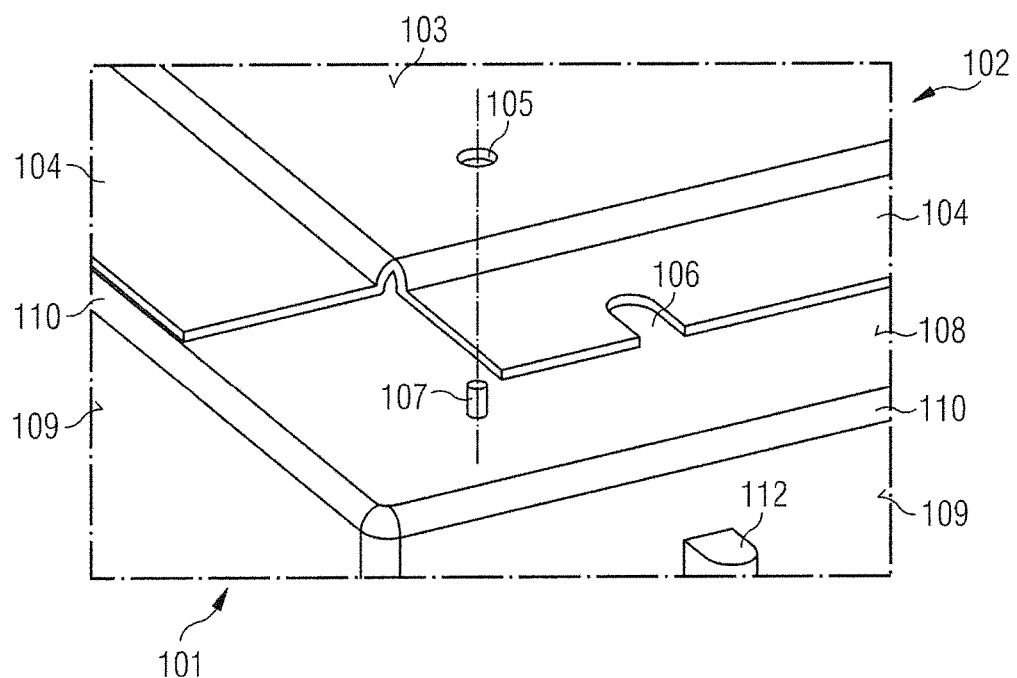
FIG. 2 is a detail of FIG. 1.

FIG. 2 shows a detail of FIG. 1. The illustrated centering hole 105 is arranged to be flush above the illustrated centering pin 107.

Figure 3:
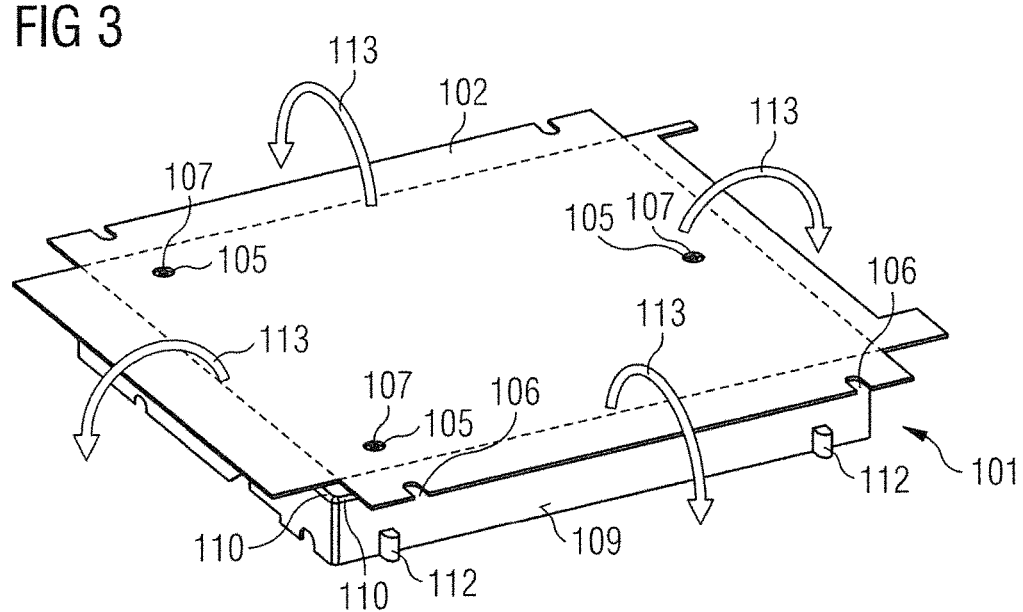
FIG. 3 is another schematic perspective illustration of an example of the carrier with the electrically conductive mesh.

FIG. 3 shows the electrically conductive mesh 102 during the mounting process. The base 103 of the electrically conductive mesh 102 rests on the base 108 of the carrier 101. The base 103 of the electrically conductive mesh 102 and the base 108 of the carrier 101 have the same size. The centering pins 107 engage in the centering holes 105 and thus position the electrically conductive mesh 102 precisely over the carrier 101 such that the base 103 of the mesh 102 rests on the base 108 of the carrier 101 in an accurately fitting manner.

Arrows 113 show the directions in which the lugs 104 of the electrically conductive mesh 102 are cambered over the edges 110 of the carrier 101 to butt against the side surfaces 109 of the carrier 101.

Figure 4:
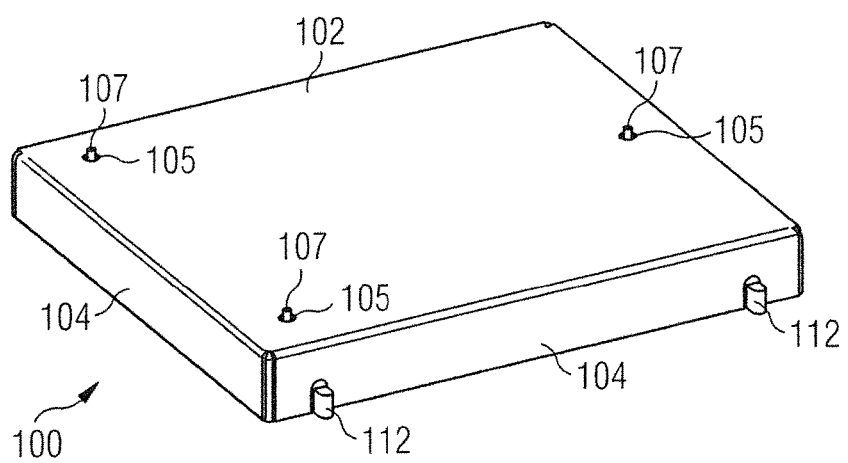
FIG. 4 is a perspective schematic illustration of an assembly with the carrier and the electrically conductive mesh arranged thereon.

FIG. 4 shows an assembly 100. In the assembly 100, the electrically conductive mesh 102 is attached to the carrier 101. In this case, the base 103 of the electrically conductive mesh 102 covers the base 108 of the carrier 101. The centering pins 107 protrude through the centering holes 105. The lugs 104 of the electrically conductive mesh 102 are attached to the side surfaces 109 of the carrier 101 and cover these. The spacers 112 of the carrier 101 protrude through the recesses 106. The spacers 112 ensure a distance of a housing to the carrier 101 and the electrically conductive mesh 102 when the carrier 101 is inserted into an electronic device.

Figure 5:
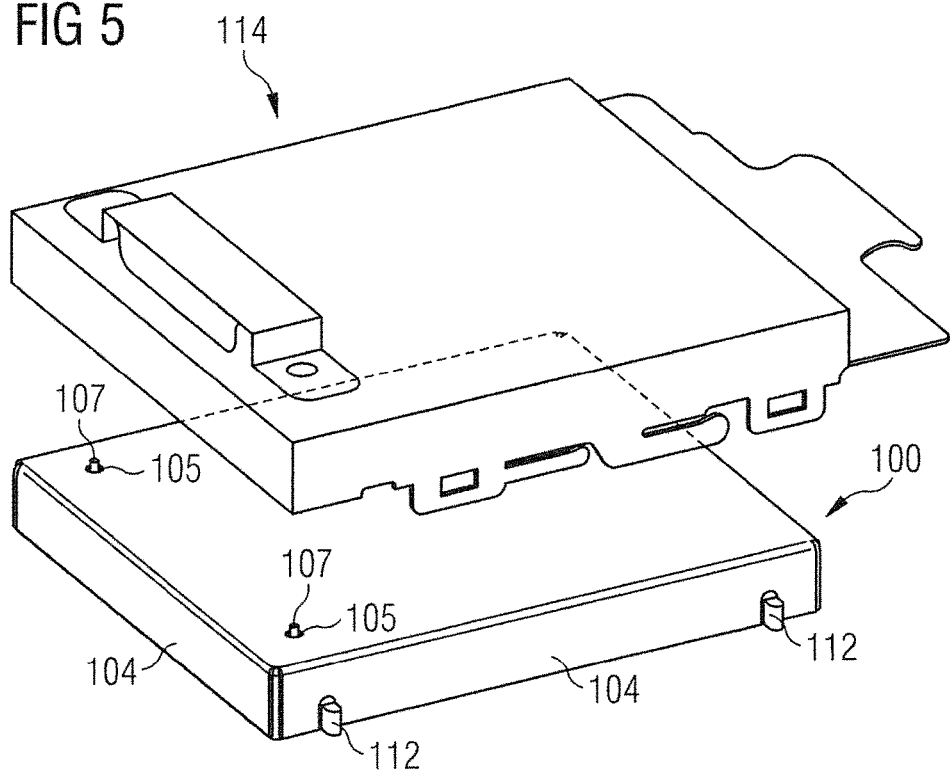
FIG. 5 is a perspective schematic illustration of the electrically conductive mesh attached to the carrier with a housing.

FIG. 5 shows the assembly 100 together with a housing 114. The housing 114 can be lowered over the assembly 100 to position the carrier 101 in the housing 114. In other words, the carrier 101 is inserted in the housing 114 together with the electrically conductive mesh 102 attached to the carrier 101. Security-relevant electronics (not shown) is placed below the electrically conductive mesh 102 within the carrier 101 and is protected. The electrically conductive mesh 102 surrounds the security-relevant electronics with the base 103 of the electrically conductive mesh 102 and the lugs 104 from five sides.

Figure 6:
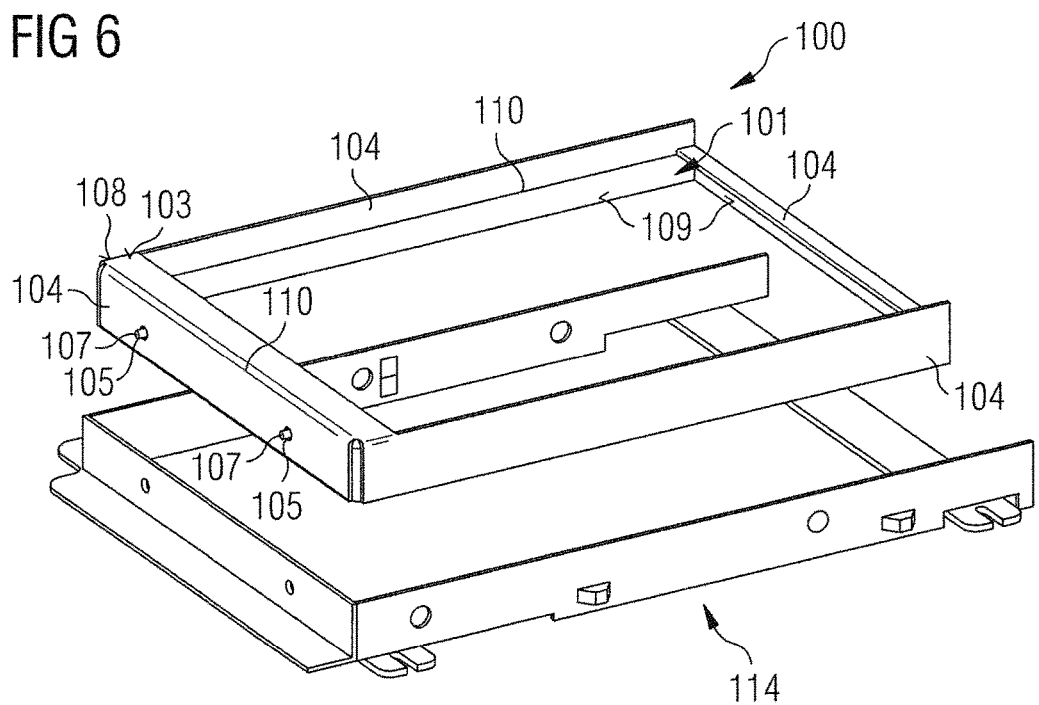
FIG. 6 is an alternative example of an electrically conductive mesh attached to a carrier and a housing.

FIG. 6 shows an alternative example of the carrier 101. The carrier 101 according to the example of FIG. 6 comprises a rectangular base 108 merely connected to 3 side surfaces 109 via edges 110. Alternatively, the base 108 can be omitted. In further examples, the carrier 101 may consist of less than four side surfaces 109 or of more than four side surfaces 109. In these examples, the carrier 101 is not circumferentially closed then or has a base different from a rectangular base.

The carrier 101 according to the example in FIG. 6 comprises four side surfaces 109 with edges 110 that adjoin the side surfaces 109. The carrier 101 comprises centering pins 107 on one of the side surfaces 109. The electrically conductive mesh 102 comprises corresponding centering holes 105 on one of the lugs 104.

In this example, the electrically conductive mesh 102 has a shortened base 103 of the electrically conductive mesh 102 that adjoins three of the four circumferential lugs 104 and has the full length of one of the three adjoining lugs 104. The base 103 adjoins the lug 104, in which the centering holes 105 are arranged, and is bent over the edge 110 of the carrier 101, which connects the side surfaces 109 to the centering pins 107 and the base 108 of the carrier 101.

Two further lugs 104 protrude from two further side surfaces 109 of the carrier 101 and thus protect components protruding from the carrier 101 and components constructions such as a display (not shown) attached to the electronic device, in particular a transition between the attached display and the electronic device. The edges 110 over which the electrically conductive mesh 102 is not cambered do not have a predefined radius in this example.

At a fourth (illustrated to the right) side of the carrier 101, a lug 104 of the electrically conductive mesh 102 is kinked to enable insertion of the display into the assembly 100 after positioning the electrically conductive mesh 102 on the carrier 101.

Fixing the electrically conductive mesh 102 on the carrier 101 is effected by an adhesive (joint) in the described examples of FIGS. 1 to 6. An adhesive layer is applied in some places or over the entire surface of the base 108 (if present) of the carrier 101 as well as the side surfaces 109.

Just as well, it is possible to apply the adhesive layer on the electrically conductive mesh 102 (in addition or as an alternative). In further examples, the electrically conductive mesh can be fixed without adhesive layer by plugging it to or on the carrier 101.

Although my assemblies and devices have been described in connection with specific forms thereof, it will be appreciated that a wide variety of equivalents may be substituted for the specified elements described herein without departing from the spirit and scope of this disclosure as described in the appended claims.

The invention claimed is:

1. An assembly comprising a carrier and an electrically conductive mesh, wherein:
   the carrier comprises multiple side surfaces and a base with which the multiple side surfaces are connected, wherein the side surfaces of the carrier form a circumferential frame such that a tray-shaped reception is formed,
   the side surfaces each comprise an edge and the edges of the side surfaces each have a radius at least as big as a minimal bending radius of electric lines of the electrically conductive mesh,
   the electrically conductive mesh is attached on the external surface of the tray-shaped carrier and extends over the edges of the side surfaces, and
   the carrier comprises centering means and the electrically conductive mesh is centrally arranged on the carrier by the centering means.

2. The assembly according to claim 1, wherein the carrier is made of a plastic material.

3. The assembly according to claim 1, wherein the electrically conductive mesh connects to the carrier via an adhesive joint.

4. The assembly according to claim 1, wherein the electrically conductive mesh comprises a rectangular base to which one or multiple lugs are adjoined, and the mesh is arranged with the one or multiple lugs on respective side surfaces.

5. An electronic device comprising the assembly according to claim 1 and a circuit board, on which security-relevant electronics are arranged, wherein the circuit board is arranged in the carrier such that the electrically conductive mesh at least partially surrounds the circuit board.

6. The electronic device according to claim 5, comprising a housing, wherein the assembly is arranged in the housing such that the electrically conductive mesh is arranged between the circuit board and the housing.

\* \* \* \* \*